(12) United States Patent  (10) Patent No.: US 7,805,698 B1
Ferguson et al.  (45) Date of Patent: Sep. 28, 2010

(54) METHODS AND SYSTEMS FOR PHYSICAL HIERARCHY CONFIGURATION ENGINE AND GRAPHICAL EDITOR

(75) Inventors: Kenneth Ferguson, Edinburgh (GB); Kenneth Mackie, Edinburgh (GB); Gilles S. C. Lamant, Sunnyvale, CA (US); Sravasti Gupta Nair, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 368 days.

(21) Appl. No.: 11/857,985

(22) Filed: Sep. 19, 2007

(51) Int. Cl.
*G06F 17/50* (2006.01)
(52) U.S. Cl. .............. 716/18; 716/1; 716/2; 716/3; 716/4; 716/5; 716/9; 716/11; 716/19
(58) Field of Classification Search .............. 716/1–5, 716/9, 11, 18, 19
See application file for complete search history.

(56) References Cited

U.S. PATENT DOCUMENTS

| 5,671,432 | A  | * | 9/1997  | Bertolet et al. ............ 712/11 |
| 6,631,508 | B1 | * | 10/2003 | Williams ................... 716/8  |
| 7,146,586 | B2 | * | 12/2006 | Bohl et al. ................. 716/4  |
| 7,278,122 | B2 | * | 10/2007 | Willis ....................... 716/3  |
| 7,386,819 | B1 | * | 6/2008  | Yuan et al. ................. 716/5  |
| 7,526,740 | B2 | * | 4/2009  | Bohl et al. ................. 716/4  |
| 7,530,048 | B2 | * | 5/2009  | Joshi ........................ 716/19 |
| 7,546,571 | B2 | * | 6/2009  | Mankin et al. ............. 716/15 |
| 7,549,133 | B2 | * | 6/2009  | Lee et al. ................... 716/1  |
| 2006/0101368 | A1 | * | 5/2006 | Kesarwani et al. ........ 716/11 |
| 2008/0128637 | A1 | * | 6/2008 | Yoshida et al. ......... 250/492.2 |
| 2009/0007031 | A1 | * | 1/2009 | Ginetti et al. ............... 716/4 |
| 2009/0113369 | A1 | * | 4/2009 | Colwell et al. ............ 716/11 |
| 2009/0172624 | A1 | * | 7/2009 | Lamant ....................... 716/9 |

* cited by examiner

*Primary Examiner*—Helen Rossoshek
(74) *Attorney, Agent, or Firm*—Sheppard Mullin Richter & Hampton LLP (57) ABSTRACT

In one embodiment a new method to address configuring a logical design and libraries of design elements with additional information is proposed that may be used to create a physical design from that logical design. Logical designs may be generic, while physical design libraries are normally targeted towards specific technology. Consequently, there can be a mapping from the cells in a logical library to cells which correspond to their implementation in a physical library. In one embodiment, annotations required to map from logical design to physical design may be stored in a separate design view. In one embodiment the user can modify the physical mapping attributes of cells, instances, and occurrences in the logical design and save the modifications back to the physical configuration view.

29 Claims, 7 Drawing Sheets

| Occurrence Name | Logical Library | Logical Cell | Logical View | Physical Library | Physical Cell | Physical View | Inherited View List | Inherited Stop List | Ignore | Force descend |
|---|---|---|---|---|---|---|---|---|---|---|
| Top | logLib2 | Top | schematic | | | | | | n | n |
| Top/T1 | logLib | NAND2 | schematic | | | | | | n | y |
| TopT1/N1 | logLib | NMOS | symbol | phyLib | NMOS | layout | schematic symbol | layout abstract | n | n |
| TopT1/N2 | logLib | NMOS | symbol | phyLib | NMOS2 | layout | schematic symbol | layout abstract | n | n |
| TopT1/P1 | logLib | PMOS | symbol | phyLib | PMOS | layout | schematic symbol | layout abstract | n | n |
| TopT1/P2 | logLib | PMOS | symbol | phyLib | PMOS | | schematic symbol | layout abstract | n | n |
| TopT1/VDD1 | logLib | VDD | symbol | | | | schematic symbol | layout abstract | y | n |
| TopT1/GND1 | logLib | GND | symbol | | | | schematic symbol | layout abstract | y | n |
| Top/T2 | logLib | NAND2 | schematic | phyLib | NAND2 | layout | schematic symbol | layout abstract | n | n |
| TopT2/N1 | logLib | NMOS | symbol | | | | schematic symbol | layout abstract | n | n |
| TopT2/N2 | logLib | NMOS | symbol | | | | schematic symbol | layout abstract | n | n |
| TopT2/P1 | logLib | PMOS | symbol | | | | schematic symbol | layout abstract | n | n |
| TopT2/P2 | logLib | PMOS | symbol | | | | schematic symbol | layout abstract | n | n |
| TopT2/VDD1 | logLib | VDD | symbol | | | | schematic symbol | layout abstract | y | n |
| TopT2/GND1 | logLib | GND | symbol | | | | schematic symbol | layout abstract | y | n |
| Top/T3 | logLib | NAND2 | schematic2 | | | | schematic2 symbol | layout abstract | n | n |
| TopT3/X1 | logLib2 | X | symbol | phyLib | X | layOpr | schematic2 symbol | layout abstract | n | n |
| TopT3/Y1 | logLib2 | Y | symbol | phyLib2 | Y | layoutA | schematic2 symbol | layout abstract | n | n |

*FIG. 4*

```
<MAPPINGS>
    <LIB NAME="phyLib" >
        <CELL NAME= "NAND2" >
            <VIEW NAME="layout" >
                <LOGICAL_CELL>
                    <LIB NAME="logLib" >
                        <CELL NAME="NAND2" >
                            <VIEW NAME="symbol" />
                        </CELL>
                    </LIB>
                </LOGICAL_CELL>
            </VIEW>
        </CELL>
    </LIB>
</MAPPINGS>
```

*FIG. 5*

```
config Top;
  design logLib.Top:schematic;
  liblist phyLib phyLib2;

viewlist schematic, symbol;
  constraintviewlist constraint;
stoplis t layout, abstract;

inst (logLib.Top:schematic).I3 viewlist schematic2, symbol;

path (logLib.Top:schematic).(logLib.NAND2.schematic)I1.N2
{
    non-    inherited string prop physicalBinding = "phyLib NMOS2 layout"
} inst (logLib.Top:schematic).I1
{
    non-    inherited int prop forceDescend = 1;
} inst (logLib.NAND2:schematic2).X1
{
    non-    inherited string prop physicalStopList = "layOpt abstract";
} cell logLib2.Y
{
    non-    inherited string prop physicalBinding = "phyLib Y layoutA"
}
```

*FIG. 6*

| Physical Library List | phyLib phyLib2 |
| --- | --- |
| Inherited View List | schematic symbol |
| Physical Stop List | layout abstract |

*FIG. 7*

| Logical Library | Logical Cell | Logical View | Physical Library | Physical Cell | Physical View | Inherited View List | Inherited Stop List | Ignore | Force descend |
|---|---|---|---|---|---|---|---|---|---|
| logLib | Top | schematic | | | | | | n | n |
| logLib | NAND2 | schematic | PhyLib | NAND2 | layout | schematic symbol | layout abstract | n | n |
| loblib | NMOS | symbol | phyLib | NMOS | layout | schematic symbol | layout abstract | n | n |
| logLib | PMOS | symbol | phyLib | PMOS | layout | schematic symbol | layout abstract | n | n |
| logLib | VDD | symbol | | | | schematic symbol | layout abstract | y | n |
| logLib | GND | symbol | | | | schematic symbol | layout abstract | y | n |
| logLib | X | symbol | phyLib | X | layout | schematic symbol | layout abstract | n | n |
| logLib2 | Y | symbol | phyLib2 | Y | layoutA | schematic symbol | layout abstract | n | n |

METHODS AND SYSTEMS FOR PHYSICAL HIERARCHY CONFIGURATION ENGINE AND GRAPHICAL EDITOR

TECHNICAL FIELD

The present invention relates to computer-aided design and more particularly, some embodiments relate to design configuration within a computer aided design system.

DESCRIPTION OF THE RELATED ART

In some design systems, a logical design may be constructed from instances of cells in a logical design library. For example, a library can contain predefined logical functions that can be combined together to create a logical design. The logical design can then be mapped to an actual physical design. The physical design may include the actual placement of transistors on a die, for example. A logical design can have multiple physical designs. In other words, a logical design might be implemented in a number of different ways. For example, physical elements such as transistors, logic gates, input/output pins, etc. can be altered, placed at different locations on a die, different types of technologies can be used, and so on. Additionally, a logical design can also have multiple physical designs because of considerations relating to different optimization criteria, different design goals, or different yield goals.

In order to create a physical design, mappings may be defined that detail how to map instances of logical cells from logical libraries to instances of physical layout cells from technology-specific physical libraries. In some computer aided design systems, library-mapping attributes are embedded within the logical design library. Attributes are various properties to be implemented within, for example, a digital logic design. Examples of attributes include but are not limited to logic gate topology to use for a particular instance of a logic cell. One example of logic gate topology attributes can include the particular logic gates, the size and layout of those logic gates, and the like. Another example of an attribute within a logic design is the location within a design for a particular logic function within a library, for example, a designer might want a certain logic function adjacent to a particular output pin of a device.

In some cases both logical and physical libraries may be technology specific. As discussed above, a logical design can also have multiple physical designs because of considerations relating to different optimization criteria, different design goals, different yield goals, etc. For example, a logical source, such as a schematic, might typically change from configuration to configuration in the design of some custom integrated circuits. Alternatively, as discussed above, some custom integrated circuit designers and manufacturers may use a generic design library.

Mapping to a new physical library, for example, for a new technology, might require the user to change the attributes stored as properties in the logical library. This may require the designer to change attributes on a transistor-by-transistor basis. This might, in some cases, be time consuming, especially in a large design. Additionally, in some cases, mapping to multiple technology libraries may be difficult because only one set of mapping information may be stored as properties in each logical library cell or instance.

Directives and attributes used to map logical design components to physical design components are, in some cases, embedded inside the logical design itself. This may require the logical design cells and instances to be modified after the logical design is complete.

Modifications to the mapping between the logical design and the physical design might mean that changes to logical design elements are required. This means that the person who defines the mapping has to have write privileges to the data base that contains the logical design. For example, this might involve the addition or modification of properties within the data base that contains the logical design. In some cases mapping a single generic logical library to multiple technology-specific physical libraries may be difficult because it might be necessary to store different properties for each physical library on the same cells in the logical library.

Further, in some systems it is not possible to visualize the logical design elaborated in the context of a physical domain because the logical design tools do not read the physical design mapping attributes that are added to the logical design. In some cases, the first opportunity for the user to see the effects of the physical design elaboration directives is during the creation of the physical layout inside the physical layout editor itself.

In some cases, designers need to override the standard library mappings that are set for each cell with individual settings for a particular cell, or for instances or occurrences of those cells inside a particular design. In some systems, this may be accomplished using design attribute settings. For example, global design attributes to control embedded elaboration, such as global stop lists and view lists for elaboration, are specified as options in the physical design editor. Design-level overrides for the cells and instances in a specific design have to be specified in a separate ASCII text file.

Designers might require that a portion of their logical design be mapped to a newly created physical cell, known as a soft block. The invention provides a mechanism to specify which portion of the logical design is mapped to a soft block and a mechanism to allow the soft block layout parameters to be specified easily. A separate tool was often used to specify the parts of the logical design hierarchy that were to be implemented as soft blocks.

Designers could benefit from a tool that may open a schematic design and elaborate a physical design hierarchy from it, obeying the attributes specified for mapping from the logical to the physical domain. Some computer aided design systems embed elaboration of the physical design inside the physical layout editor. In some cases a user may not visualize the physical design elaboration until implementing the physical design, and the task of setting the logical to physical mapping attributes was done in the logical design editor without the user being able to see the effects of the mapping attributes on the physical design elaboration.

BRIEF SUMMARY OF EMBODIMENTS OF THE INVENTION

According to one embodiment of the invention, a new method to address configuring a logical design and libraries of design elements with additional information is proposed that may be used to create a physical design from that logical design. Logical designs might be generic, i.e. not targeted to a specific technology process, while physical design libraries are normally targeted towards specific technology. Consequently, there can be a mapping from the cells in a logical library to cells that correspond to their implementation in a physical library.

In one embodiment, annotations required to map from logical design to physical design may be stored in a separate design view. This design view is called a physical configuration view. The annotations required to map logical library cells to physical library cells may be stored in an XML file known as a library attributes mapping file ("LAM file"). By using a separate design view it may be possible to define and edit the mapping from a logical design to a physical design without requiring write access to the logical design.

In another embodiment, a new tool, known as a physical hierarchy configuration editor, may read the physical configuration view for a design and the LAM files for the libraries in the design. The tool may present to the user an elaborated view of the logical design, in the context of the physical design, with all the physical design mapping attributes displayed.

In one embodiment, the physical hierarchy configuration editor lets the user modify the physical mapping attributes of cells, instances, and occurrences in the logical design and save the modifications back to the physical configuration view. The updated physical configuration view may then be used within the physical layout editor tool to elaborate the physical design components and drive the physical implementation.

In yet another embodiment, the physical hierarchy configuration editor may be open at the same time as the logical design editor, in which case modifications to the logical design are immediately reflected in the physical hierarchy configuration editor. Similarly, it may be open at the same time as the physical layout editor, in which case modifications to the physical configuration are immediately notified to the physical layout editor.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

The figures are not intended to be exhaustive or to limit the invention to the precise form disclosed. It should be understood that the invention may be practiced with modification and alteration, and that the invention be limited only by the claims and the equivalents thereof.

DETAILED DESCRIPTION OF THE
EMBODIMENTS OF THE INVENTION

In many instances, a logical design can be physically implemented in a number of ways. For example, even a single NAND gate can be implemented using different types of transistors or process technologies, including, for example, NMOS, CMOS, BiCMOS, or PMOS transistors, just to name a few of the conventionally available process technologies. Accordingly, because a logical design can have many different physical implementations, additional information may need to be stored to define a mapping from the logical design to the physical implementation. In one embodiment, a new method to address configuring a logical design and libraries of design elements with additional information is provided that can be used to create a physical design from that logical design. Annotations required to map from a logical design to a physical design may be stored in a separate design view, rather than storing the information in the logical design. This can allow different mappings to be created for a given logical design and, in one embodiment, such mappings can be performed without modifying the logical design.

Before describing the invention in detail, it is useful to describe an example environment with which the invention might be implemented. In one embodiment, the invention can be implemented using computer aided design software running on a computer or computing system. The computer or computing system might be a personal computer, minicomputer, mainframe, etc. The computer might include various input devices, such as a keyboard, mouse, trackball, etc.; various output devices, such as a monitor, printer, etc.; various communication ports such as network connections, USB ports, serial and parallel I/O ports, etc.; and various storage devices, such as ROM, RAM, disk drives, magnetic disks, magnetic tape drives, etc. Additionally, it will be understood by one of ordinary skill in the art that the computer may be a workstation, desktop computer, laptop computer, or other computing system.

The input devices can be used by the designer to input design elements for a design on which he or she is working. A keyboard, tablet, pointing device and the like might be used to enter commands, data and other information; access libraries and directories; select, move and position design elements; and otherwise control the operation of the computing system. Monitors and printing devices can be used to provide a visual display of the design as well as other ancillary information to aid the developer in the design process, including various GUIs, graphical representations and other information. Storage devices, whether networked or local, can be used to store data and other information including design tools, design kit information, libraries and so on.

Having thus described an example environment where design software can run on a computer, we will now discuss various example embodiments of methods and systems for physical hierarchy configuration in terms of this example environment. These methods and systems may include storing annotations required to map from a logical design to a physical design in a separate design view. In another embodiment annotations required to map logical library cells to physical library cells can be stored in a separate file. After reading this description in terms of this environment, it will become apparent to one of ordinary skill in the art how alternative embodiments can be provided and how the invention can be implemented in alternative environments.

Figure 1:
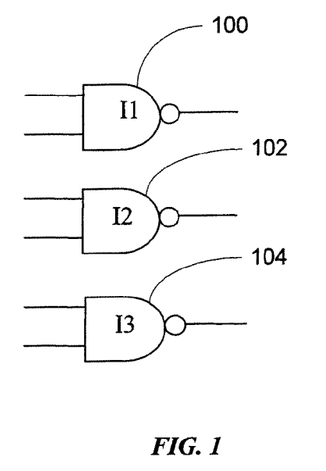
FIG. 1 is a diagram illustrating an example top-level schematic for an example of a design with which the invention can be used.
Figure 2:
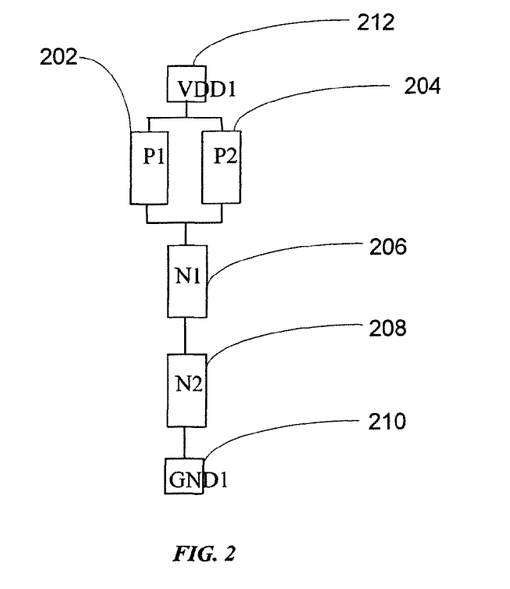
FIG. 2 is a diagram illustrating one example physical implementation of a NAND gate.
Figure 3:
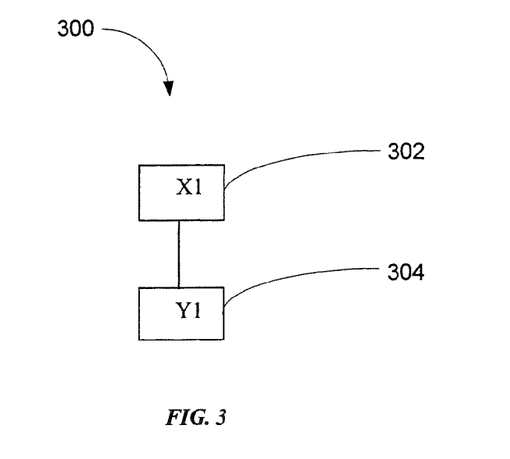
FIG. 3 is a block diagram illustrating another possible implementation of a NAND.

FIG. 1 is a diagram illustrating an example top-level schematic for an example of a design with which the invention can be used. FIG. 2 is a diagram illustrating one example physical implementation of a NAND gate. FIG. 3 is a block diagram illustrating another possible implementation of a NAND.

Referring now to FIGS. 1, 2 and 3, the example schematic diagram is a "top-level" view of one possible example design that can be used in conjunction with the methods and systems described herein. The top-level design in this example includes three NAND gates 100, 102, and 104. The NAND gates 100, 102, and 104 may all be instances from a top-level logic library, for example. In one example design, different physical designs can be used to implement one or more of the NAND gates 100, 102, and 104. For example, NAND gate 100 can be made up of different individual PMOS and NMOS gates and described by each of these individual gates, as illustrated in FIG. 2. NAND gate 102 can be made up of different individual PMOS and NMOS gates and described by a reference to the NAND gate illustrated in FIG. 2. As another example, NAND gate 104 may be made up of different individual logic gates X1 and Y1 as illustrated in FIG. 3. These design elaborations illustrating physical design annotations are further discussed with respect to the elaboration tree illustrated in FIG. 4.

In one embodiment, the physical hierarchy configuration engine or module may read LAM files associated with libraries, for example, libraries "physLib1" and "physLib2", along with a specified physical configuration view for the "top level" design illustrated in FIG. 1. Based on these inputs, the physical hierarchy configuration engine might elaborate the design to create an elaboration tree. By using a separate design view, such as a LAM file, it may be possible to define and edit the mapping from a logical design to a physical design without requiring write access to the logical design.

Referring again to FIG. 2, NAND gate 200 may be made up of PMOS 202 and 204 and NMOS 206 and 208 transistors. As illustrated P1 202 and P2 204 may be symbols indicating instances of PMOS transistors from a logic library. These transistors may be configured as illustrated in FIG. 2 to perform the functionality of a NAND gate. Additionally, NAND gate 200 may be powered by VDD1 212 and tied to GND1 210.

As discussed above, The NAND gates 100 and 102 of FIG. 1 may be elaborated in terms of the NAND gate 200 illustrated in FIG. 2 or in terms of the individual transistors 202, 204, 206, and 208, also illustrated in FIG. 2. Additionally, NAND gate 104 may be elaborated using NAND gate 300 of FIG. 3. NAND gate 300 may, as the example in FIG. 3 illustrates, be made up of X1 302 and Y1 304. NAND gate 300 is intended to illustrate that many different topologies may be used to elaborate the various functionality, such as NAND gates, within a design.

Figure 4:
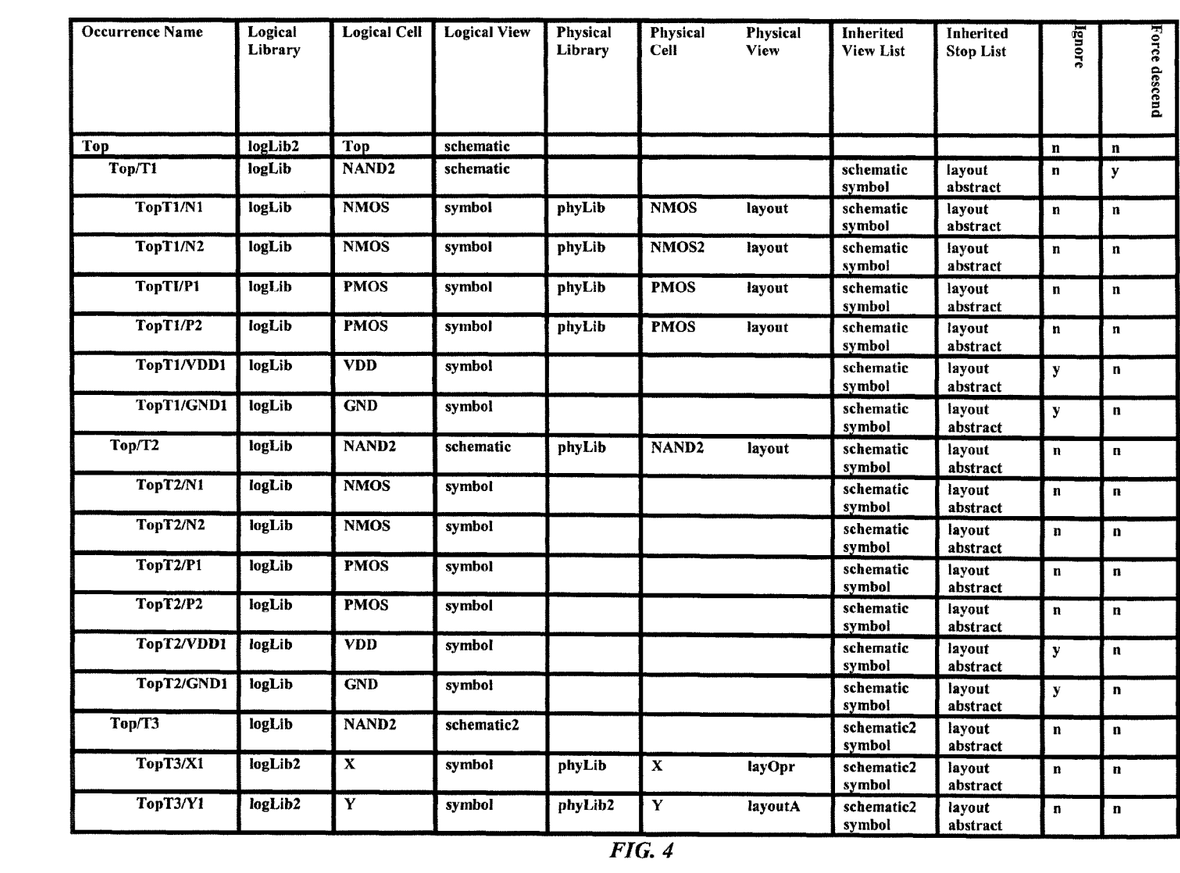
FIG. 4 is a table illustrating an example of physical design annotations for the one version of the example design.

FIG. 4 illustrates a table that might be used to summarize design elaboration in accordance with one embodiment of the invention. The design elaboration, as illustrated in this example, may be, in one embodiment, a top-level design elaboration. As illustrated, each row in the table in FIG. 4 corresponds to an occurrence in the current logical design elaboration. For example, the occurrence name "Top" may indicate the top level schematic illustrated in FIG. 1. As can be seen in FIGS. 1 and 4, Top may include various sub levels For example, Top may be made up of Top/I1, Top/I2, and Top/I3, which are also referred to as NAND gates 100, 102, and 104 of FIG. 1. Additionally, a top level may be the highest level in the hierarchy, or it may refer to one level that is higher than other referenced levels, whether or not it is the actual topmost level.

In addition to occurrence name, the table illustrated in FIG. 4 might include the logical library, logical cell, and logical view used for each occurrence. A logical library may be a library file that contains various logical elements available to a logic designer. One or more logical libraries may be used in a given design. For example, in the example design illustrated herein two logical libraries are used, "logLib" and "logLib2". Logical cells may include various logic gates, transistors, or other devices within a logic library. For example, NAND2 may be a 2 input NAND, NMOS and PMOS may be NMOS or PMOS transistors, respectively, etc. Logical view can indicate if a given library element is a schematic element or a symbol. For example, the top level schematic and NAND gates 100, 102, and 104 are schematic elements, while the individual logic gates are symbols.

As discussed above, a logical design may be mapped to a physical design so that the logical design may be implemented in some device, such as an ASIC or other electronic circuit. The table of FIG. 4 illustrates various parts of this mapping. Occurrences might be mapped to various physical cells that may be in various physical libraries. For example, the example design includes two physical libraries: phyLib and phyLib2. Accordingly, various libraries may be available to a designer and the designer may select from various components within these libraries. For example, various physical cells are illustrated in the example of FIG. 4, including NMOS, PMOS, NAND, X, Y, and NMOS2 cells, as discussed with respect to FIGS. 1, 2, and 3.

The inherited view list in one embodiment indicates mapping of an occurrence name. For example, "Top/I3" maps to "schematic2" (FIG. 3) as illustrated in the table of FIG. 4, while "Top/I1" and "Top/I2" map to "schematic1" (FIG. 2) as illustrated in the table of FIG. 4.

The inherited stop list can be used to tell the system how far down to go within a given hierarchy. By modifying the entry in the Inherited Stop List column, it may be possible to control the physical cell views searched during elaboration for the occurrence in that row and all its descendants. In FIG. 4, "Top/I3/X1" has had its Physical Stop List changed to "layOpt abstract" causing this occurrence to map to physical cell view "physLib/X/layOpt".

Ignore indicates in one embodiment that a device should be ignored. For example, GND and VDD might be ignored. GND and VDD indicate power connections. These connections generally do not require a logic gate. They may take up some routing resources, for example, but generally, the power connections are not a logic gate.

Force descend forces the design tool to descend lower into a design hierarchy. This can allow a designer to use a higher or lower level design item. Accordingly, in the example, force descend is generally set to "n" for no. In other words, do not force descend. Accordingly, TOP/I1, for which force descend is set to "y", will include entries in physical library, physical cell, and physical view for each occurrence down to the lowest level gates. Top/I2 for which force descend is set to "n", will not include entries in physical library, physical cell, and physical view for each occurrence down to the lowest level logic gates. The NAND2 gate from the phyLib is a known device, and the physical design can be expressed in terms of NAND2, rather than requiring Top/I2 to be expressed in terms of lower level gates.

As will be understood by those of ordinary skill in the art and illustrated in FIGS. 1, 2, 3, and 4, a design may start with a top level design, such as a top level schematic. Below the top-level design may be additional schematics and symbols that illustrate the design in more detail. For example, FIG. 2 illustrates one possible example of a NAND gate 200 and the transistors 202, 204, 206, and 208 that make up NAND gate 200. As will be understood by a person of ordinary skill in the art, transistors 202, 204, 206, and 208 can be further defined at a lower relative level by schematics or symbols. Additionally, different types of transistors may be used within one design. For example, NMOS transistor 206 could, in some cases, be a different type of NMOS transistor than NMOS transistor 208. Designs can include digital logic designs, as illustrated in FIG. 1, or other designs, such as analog designs, or mixed analog and digital designs, etc.

In one embodiment, the physical hierarchy configuration editor can be implemented such that the user may modify the computed entries in the columns for each row. For example, to map a specific logical occurrence to a specific physical cell view, the user enters the information under the Physical Library, Physical Cell or Physical View columns in the row corresponding to that occurrence. In FIG. 4, for example, the row for occurrence "Top/I2/N2" has had the physical cell name "NMOS2" entered into that column by the user. In this example, "NMOS2" is shown in bold typeface. It will be understood that other indications such as underlining, italics, font, font size, color, arrows, borders, or others might be used to indicate that a user has entered information into a cell. In one embodiment, all entries made in this fashion may be saved into the physical configuration view currently being edited when the user performs a File—Save command in the editor.

Similarly, the user may modify the Inherited View List entry to control the elaboration of the logical design hierarchy. In FIG. 4, the entry for occurrence "Top/I3" has been set to "schematic2 symbol". The elaboration engine has therefore elaborated instance "Top/I3" to the "Top/I3/schematic2" cell view shown in FIG. 3.

By modifying the entry in the Inherited Stop List column, it may be possible to control the physical cell views searched during elaboration for the occurrence in that row and all its descendants. In FIG. 4, "Top/I3/X1" has had its Physical Stop List changed to "layOpt abstract" causing this occurrence to map to physical cell view "physLib/X/layOpt".

The Force Descend feature in one embodiment lets the user specify that even if a logical occurrence or instance or cell has a mapping to a physical cell view, then that mapping should be ignored and instead the elaborator engine should descend into the children and search for mappings to physical cell views at that level. For example, in FIG. 4 occurrence "Top/I2" has Force Descend set, causing the mapping to "physLib/NAND2/layout" to be ignored; instead, its children are mapped to physical cell views instead.

The Ignore setting for an occurrence or instance or cell in one embodiment causes that object to be ignored when mapping to the physical design. For example, some logical cells might always be ignored since because they generally do not map to cells in the physical domain. For example, in the design shown in FIG. 2, "VDD" and "GND" are generally not mapped to cells and are can in some embodiments be ignored.

In one embodiment, when working with a top-level logical design some of the logical cell views instantiated in this top-level design may already have a configuration cell view defined for them. In one embodiment, an elaborator might be configured to choose to elaborate into a sub-physical configuration cell view instead of the regular schematic cell view. This means that all of the configuration settings specified inside the sub-configuration will be honored while the top-level design is elaborated without the need to specify them again in the top level physical configuration cell view.

The elaboration tree may be expandable and contractible. For example, in one embodiment a hierarchical logical instance can be in an unexpanded state, e.g., where none of its subcomponents are visible in the elaboration tree. If a logical instance in the tree is expanded an instance at the next level of the elaboration tree can be displayed. Conversely, a logical instance in the tree can also be contracted such that lower level sub-components of a logical instance are not visible.

Figure 5:
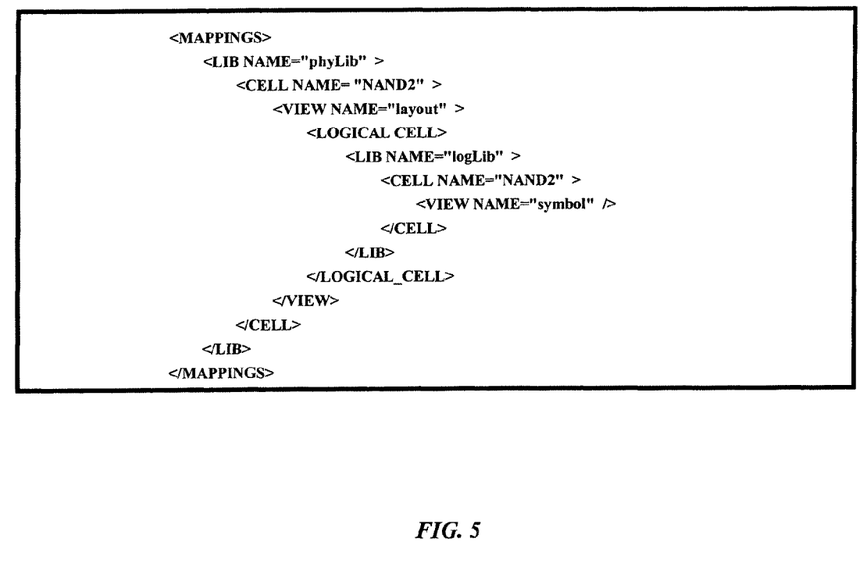
FIG. 5 is a diagram illustrating an example LAM file for one version of an example design.

In one embodiment, library attribute mapping information may be stored in a separate XML file called a LAM file rather than embedding the mapping attributes inside the logical cells. FIG. 5 is a diagram illustrating an example LAM file for one version of an example design. The LAM file may store logical to physical mapping attributes for physical library cells in a single file associated with the library. A LAM file can contain the mapping information for all of the cells in a given physical library, specifying how cells in another logical library map to these physical cells. In some cases, separating the library attribute mapping information from the logical and physical cells can be performed so that the logical cells do not have to be edited and annotated with mapping information, as was the case with the prior solutions.

In one embodiment of the LAM file, the logical to physical mapping information is not embedded inside the logical cell views inside the logical library. This means that mappings may be created without modifying the logical design. Logical designers can therefore in one embodiment safely make their logical cell views read-only without preventing creation of library mapping information at a later time. In another embodiment, there may be a different LAM file for each unique physical library to which a given logical library is mapped.

In one embodiment, a new engine and graphical tool can read LAM files and physical configuration views to create and display an elaborated physical design representation. Using the physical hierarchy configuration editor in one embodiment, configuration information can be edited globally or on a cell, instance or occurrence basis. The result of any modification can be displayed in a tabular graphical format like the one shown in the FIG. 4. Configuration changes made in the graphical editor are saved back into the physical configuration view.

Figure 6:
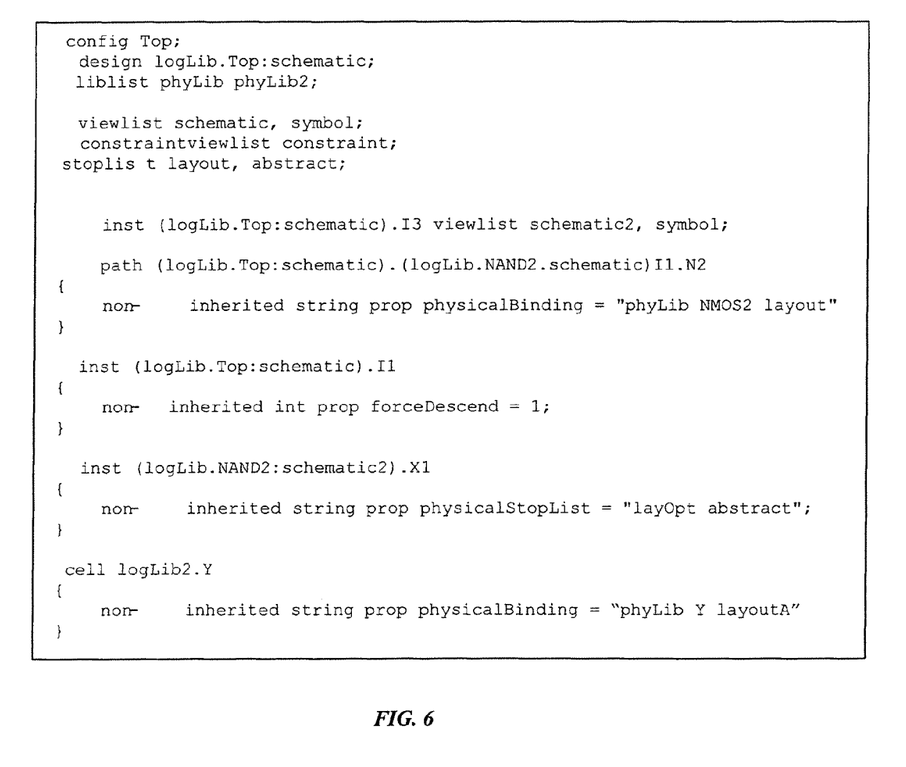
FIG. 6 is an example illustrating possible contents of an example physical configuration view of one version of an example design.

FIG. 6 illustrates an example physical configuration view that might store logical to physical mapping information for instances in a design. In one embodiment, the physical configuration view may store mapping information in a separate database cell view. The physical configuration view can be implemented as a new type of database cell view that may be used to store the settings required to map a particular logical cell view to the physical domain. Each design might have multiple physical configuration views, each of which represents a different group of configuration settings for elaborating the logical design. For example, a single logical design might be mapped to multiple physical designs for different device technologies. In this way, the same logical design might be more easily implemented in these different device technologies. In another embodiment, each cell in a logical library may have its own physical configuration views if the instances inside that cell have mapping information required to map them to the physical domain.

Figure 7:
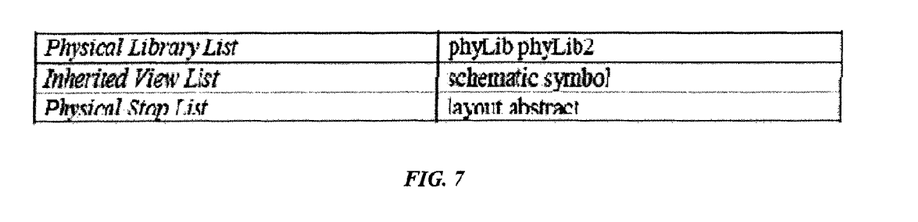
FIG. 7 is a table illustrating example global elaboration settings for one version of an example design.

In some cases, storing the design attribute settings in a separate cell view may allow for a design system that has a clean separation between the logical design, the physical design, and the configuration data that maps between the two. Additionally, the physical configuration view might be opened and edited in a new design elaboration tool. The example illustrated in FIG. 6 shows exemplary contents of a Physical Configuration View for the design in FIG. 1. The configuration view stores the global elaboration settings in addition to settings made for cells, instances or occurrences, for example, as shown in FIG. 7.

When storing design attribute settings in the physical configuration view the physical configuration information might be supported as design data. This can be done in one embodiment instead of storing the settings in a separate ASCII text file map or as options in the physical layout editor itself. Accordingly, in such an embodiment the invention can be configured such that a user may use the physical hierarchy configuration editor to open a physical configuration view and view, edit, and save the configuration information independent from editing the logical or physical design to which the configuration data refers. In one embodiment, multiple physical configuration views may be created for a single logical design, facilitating the exploration of alternative physical implementations of the logical design and the saving of these alternative physical elaboration choices.

In one embodiment, the functions of partitioning logical design components into new physical layout views, and storing the specification of these partitions in the physical configuration views can be incorporated into the physical hierarchy configuration editor. In this way, the same tool might be used to control and edit the elaboration settings from logical to physical cells and to generate the partition specifications for new physical layout cells. Such partition specifications might include the specification of the coordinates of the physical boundary of the physical boundary of the partition, the I/O pin specification including layer, width, number of pins, and the definition of obstructions within the partition, (or soft block as it is known).

By incorporating the partitioning of sections of the logical design into soft blocks in the physical configuration editor, all of the tasks associated with configuring the cells, instances and occurrences inside a logical design for mapping to physical design may be completed using a single tool.

In another embodiment, a new engine for elaborating the components in a folded logical design may incorporate into components in an unfolded logical design, with mapping annotations that specify how to map these logical design components to physical design components. Accordingly, the engine may read the logical design, a physical configuration view and any LAM files and configuration views of cells in the logical design, and generates an unfolded tree containing the logical design occurrences annotated with mapping information required to map these components into the physical domain.

In some cases, the design elaboration may be visualized in a new graphical tool referred to herein as a physical hierarchy configuration editor. In one embodiment, a physical hierarchy configuration editor can be configured to display a current design elaboration tree and can further be configured to allow the user to modify both the logical elaboration and physical mapping settings. Such modifications can be made, for example, either globally or on a cell, instance or occurrence basis. In one embodiment, modifications made to the configuration settings in the physical hierarchy configuration editor can be saved into the physical configuration view being edited.

The physical hierarchy configuration editor may be invoked, for example, by opening a physical configuration view. The logical design might be opened concurrently in the logical design editor tool and in that case, modifications to the logical design can be automatically reflected in the physical hierarchy configuration editor. Similarly, the physical layout editor may be opened on the layout view and any changes made in the physical hierarchy configuration editor can be likewise honored by the physical layout editor.

In one embodiment of the invention, a physical design elaboration engine can be configured to elaborate a logical design by applying the physical design mapping attributes specified in LAM files physical configuration views. The physical hierarchy configuration editor tool may, in one embodiment, show a graphical tree representation of the logical design elaboration annotated with physical design mapping attributes as shown in FIG. 4. Moreover, the physical design mapping attributes might be modified in the physical hierarchy configuration editor, and the effects of these changes may be seen immediately as the tree refreshes. This means that in one embodiment the user receives early feedback on any deficiencies in their physical design mapping. For example, if a logical design instance cannot be mapped to a physical design instance, then this can be clearly highlighted in the editor.

In one embodiment, a physical design elaboration engine may read LAM files and physical configuration views to create an unfolded representation of the logical design. Such a representation can, in one embodiment, be annotated with the mapping information required to map it to a physical design domain. In another embodiment, an editor might display the logical design tree elaborated for a physical design, allow edits to be made to control this elaboration, and save the modifications made to a physical configuration view. In one embodiment, physical mapping can be displayed and edited in a tabular format for each logical occurrence in the logical design.

The physical hierarchy configuration editor, the logical design editor, and the physical layout editor can be separate components or integrated together at varying levels of integration. Integration may facilitate incremental edits to the logical design, the physical configuration, or both, without requiring the design to be completely re-elaborated. As discussed above, the graphical representation of the elaboration is displayed in the editor in tabular format as shown in FIG. 4.

FIG. 7 is a table illustrating example elaboration settings for one version of an example design in accordance with one embodiment of the invention. In one embodiment, the global settings control the elaboration. The Physical Library List parameters specify the ordered list of libraries searched to find physical cells to map to. Inherited View List parameters specify the default ordered list of logical views to search for when elaborating a logical instance. Physical Stop List parameters specify the ordered default list of physical view names used to find a physical cell view to map a logical component to.

Figure 8:
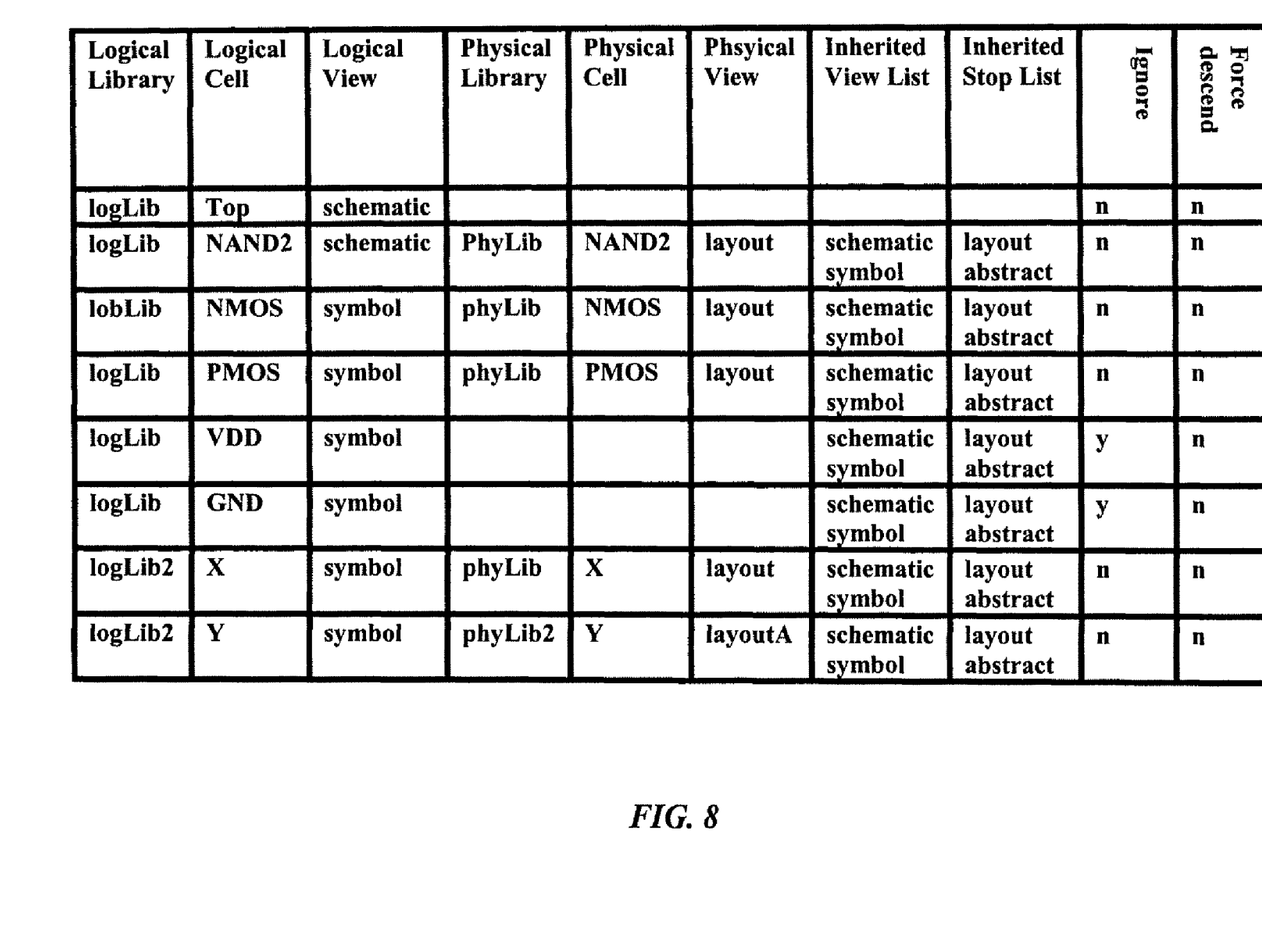
FIG. 8 is a table illustrating an example cell table that can provide a tabular view of the cells in an elaboration of the example design for one version of an example design that may allow the cells to be both edited and displayed in the table.

FIG. 8 is a table illustrating an example embodiment of a cell table that can provide a tabular view of an elaboration of the example design for one version of the example design. For example, the tool may also provide an alternative tabular view of the elaboration, which shows a table of the elaborated logical cells in the format illustrated in FIG. 8. The information in this table can be derived from the LAM entries for each of the appropriate cells shown. The user can type into this table to override the settings derived from LAM, as is shown for cell (logLib2, Y, symbol) where the Physical View has been changed to "layoutA" overriding any mapping to this logical cell view defined in LAM.

Figure 9:
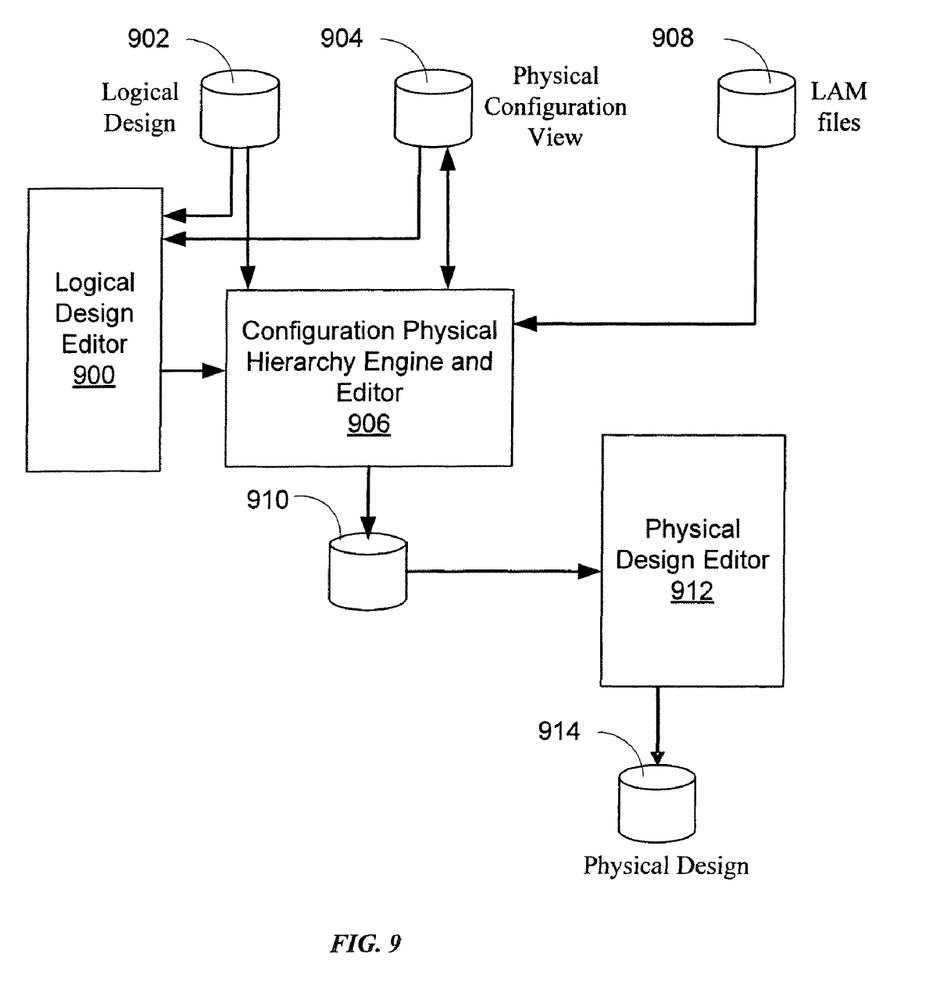
FIG. 9 is a diagram illustrating an example architecture for a physical configuration hierarchy editor.

FIG. 9 is a diagram illustrating an example architecture for a configuration hierarchy editor in accordance with one embodiment of the invention. As the example of FIG. 9 illustrates, a logical design editor 900 may be configured to take inputs from logical design 902 and physical configuration view 904. The logical design editor 900 can allow a designer to edit a logical design 902. Examples of logical design 902 might include the schematic of FIG. 1, for example. Accordingly, logical design editor 900 can be an editor that is configured to allow a designer to edit, for example, the schematic of FIG. 1. It will be understood that logical designs 902 may be entered into a system in forms other than schematics. Accordingly, logical design editor 900 may be various other types of logical design editors, including, for example, text based logical editors.

In one embodiment, annotations required to map from logical design to physical design may be stored in the physical configuration view 904. This file may, in some embodiments, be read by logical design editor 900 and the configuration physical hierarchy engine and editor 906 (configuration engine 906). Configuration physical hierarchy engine and editor 906 might be a text editor, for example, that can be used to read and edit the physical configuration view 904.

Logical design editor 900 may also be configured to output a logical design to configuration physical hierarchy engine and editor 906. Configuration physical hierarchy engine and editor 906 may also process LAM files 908 and output an elaborated logical design with physical design annotation 910. The elaborated logical design with physical design annotation 910 may be input into physical design editor 912, which in one embodiment may output a physical design 914.

Figure 10:
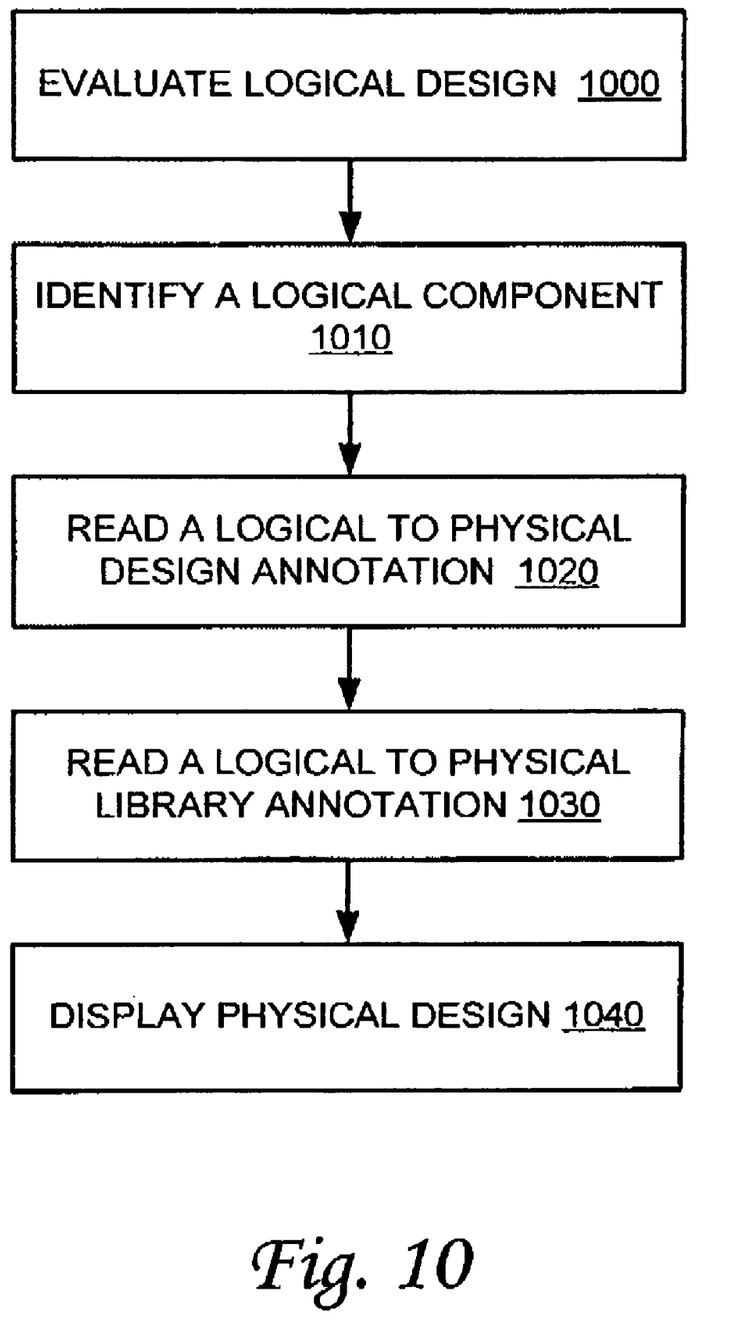
FIG. 10 is a flowchart illustrating an example method of generating a physical design implementation from a logical design.

FIG. 10 is a flowchart illustrating an example method of generating a physical design implementation from a logical design. Referring now to FIG. 10, an example method of generating a physical design implementation from a logical design comprising is discussed. At block 1000 a logical design can be evaluated. The logical design can be evaluated, for example, to check for errors in the design.

At block 1010 a logical component in the logical design can be identified. The logical component can be, for example, a logical library device, such as a NAND gate.

At block 1020 a logical to physical design annotation can be read. In one embodiment, a physical configuration view can be used to store settings required to map a particular logical cell view to a physical device. For example, the physical design annotation can indicate pins to be used for inputs and outputs in a design, areas of a die to be used for specific logical functionality, etc.

At block 1030 a logical to physical library annotation can be read. For example, in one embodiment, a library attributes mapping file (LAM file) can be read. The LAM file can contain information that specifies how cells in a library map to physical cells. The physical cells can correspond to cells in a physical device. In some cases, separating the library attribute mapping information from the logical and physical cells may mean that logical cells do not need to be edited and annotated with mapping information.

At block 1040 the physical design can be displayed. This can allow a designer to review the design, for example, to highlight any missing mappings so that layout generation will not produce errors due to missing mappings. In some embodiments, the designer might also be able to compare one physical design implementation to another physical design implementation.

It will be understood by those of ordinary skill in the art that the systems and methods described may be implemented in hardware, software, or some combination of hardware and software. Additionally, the software might run on one or more processors, microprocessors, controllers, microcontrollers, etc. As used herein, the term module might describe a given unit of functionality that may be performed in accordance with one or more embodiments of the present invention. As used herein, a module might be implemented utilizing any form of hardware, software, or a combination thereof. For example, one or more processors, controllers, ASICs, PLAs, logical components or other mechanisms might be implemented to make up a module. In implementation, the various modules described herein might be implemented as discrete modules or the functions and features described may be shared in part or in total among one or more modules. In other words, as would be apparent to one of ordinary skill in the art after reading this description, the various features and functionality described herein may be implemented in any given application and may be implemented in one or more separate or shared modules in various combinations and permutations. Even though various features or elements of functionality may be individually described or claimed as separate modules, one of ordinary skill in the art will understand that these features and functionality may be shared among one or more common software and hardware elements, and such description shall not require or imply that separate hardware or software components are used to implement such features or functionality.

While various embodiments of the present invention have been described above, it should be understood that they have been presented by way of example only, and not of limitation. Likewise, the various diagrams may depict an example architectural or other configuration for the invention, which is done to aid in understanding the features and functionality that might be included in the invention. The invention is not restricted to the illustrated example architectures or configurations, but the desired features may be implemented using a variety of alternative architectures and configurations. Indeed, it will be apparent to one of skill in the art how alternative functional, logical or physical partitioning and configurations may be implemented to implement the desired features of the present invention. Also, a multitude of different constituent module names other than those depicted herein may be applied to the various partitions. Additionally, with regard to flow diagrams, operational descriptions and method claims, the order in which the operations are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead may be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, may be combined in a single package or separately maintained and may further be distributed across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives may be implemented without confinement to the illustrated examples. For example, block diagrams and their accompanying description should not be construed as mandating a particular architecture or configuration.

What is claimed is:

1. A computer implemented method of generating a physical circuit design having a physical design from a logical design, wherein the physical design comprises a first plurality of physical cells from a physical cell library, and the logical design comprises a second plurality of logical cells from a logical cell library, the method comprising:
    using a computer system to read the logical design and identify logical cells of the second plurality;
    retrieving configuration data used to map the identified logical cell of the second plurality to the physical design;
    retrieving a logical to physical mapping attribute used to map the identified logical cell of the second plurality to a physical cell of the first plurality; and
    creating a physical design from the logical design by mapping the logical design into a physical domain based on the configuration data and the logical to physical mapping attribute,
    wherein the logical to physical mapping attribute is stored in one of a plurality of attribute libraries, each attribute library containing logical to physical mapping attributes specifying how cells in the logical library map to physical cells in the physical library.

2. The method of claim 1, wherein the configuration data for the identified logical cell is retrieved from one of a plurality of database cell views, and the configuration data enables mapping a logical cell to a plurality of technology-specific physical designs.

3. The method of claim 1, wherein the configuration data comprises logical to physical mapping information stored as a separate database cell view.

4. The method of claim 3, wherein a logical design has multiple database cell views, each database cell view representing a different group of configuration settings.

5. The method of claim 1, wherein the configuration data comprises configuration settings used to map a logical cell to a physical domain.

6. The method of claim 1, wherein the physical design is decoupled from the logical design such that the logical design can be mapped to another physical design comprising a physical cell from a new physical library without changing a logical to physical mapping attribute.

7. The method of claim 1, wherein the physical design comprises an elaboration tree having a plurality of entries corresponding to an occurrence in the logical design.

8. The method of claim 7, wherein the elaboration tree comprises a plurality of logical to physical mapping attributes.

9. The method of claim 1, wherein modifications made by a user to a logical to physical mapping attribute in the logical design are used to update the configuration data.

10. The method of claim 1, further comprising specifying configuration data for a soft block component and a soft block parameter.

11. A computer aided design apparatus for generating a physical circuit design having a physical design from a logical design, wherein the physical design comprises a first plurality of physical cells from a physical cell library, and the logical design comprises a second plurality of logical cells from a logical cell library, comprising:
    a first library comprising attribute information used to map the logical cell of the second plurality to the physical cell of the first plurality;
    a second library comprising configuration data used to map the logical cell of the second plurality to the physical design; and
    a computer readable non-transitory medium having computer program code embedded therein, the computer program code configured to cause a processing system to perform the operations of:
        reading the logical design and identifying logical cells in the logical design of the second plurality;
        retrieving a logical to physical mapping attribute from the first library, and retrieving configuration data from the second library; and
        creating a physical design from the logical design by mapping the logical design into a physical domain based on the configuration data and the logical to physical mapping attribute,
        wherein the logical physical mapping attribute is stored in one of a plurality of attribute libraries, each attribute library containing logical to physical mapping attributes specifying how cells in the logical library map to physical cells in the physical library.

12. The apparatus of claim 11, wherein the attribute information is maintained separately from the logical and physical designs.

13. The apparatus of claim 11, wherein the physical design is decoupled from the logical design such that the logical design can be mapped to another physical design comprising a physical cell from a new physical library without changing a logical to physical mapping attribute.

14. The apparatus of claim 11, wherein the physical design comprises an elaboration tree having a plurality of entries corresponding to an occurrence in the logical design.

15. The apparatus of claim 14, wherein the elaboration tree comprises a plurality of logical to physical mapping attributes.

16. The apparatus of claim 11, wherein the configuration data comprises logical to physical mapping information stored as a separate database cell view.

17. The apparatus of claim 16, wherein a logical design has multiple database cell views, each database cell view representing a different group of configuration settings.

18. The apparatus of claim 11, wherein the configuration data comprises configuration settings used to map a logical cell to a physical domain.

19. The apparatus of claim 11, wherein the processing system further performs the operations of specifying configuration data for a soft block component and a soft block parameter.

20. A computer program product for generating a physical circuit design having a physical design from a logical design, wherein the physical design comprises a first plurality of physical cells from a physical cell library, and the logical design comprises a second plurality of logical cells from a logical cell library, the computer program product comprising a computer-readable non-transitory medium having instructions embedded therein, the instructions configured to cause a processor to perform the operations of:

reading the logical design and identifying logical cells of the second plurality;

retrieving configuration data used to map the identified logical cell of the second plurality to the physical design;

retrieving a logical to physical mapping attribute used to map the identified logical cell of the second plurality to a physical cell of the first plurality; and creating a physical design from the logical design by mapping the logical design into a physical domain based on the configuration data and the logical to physical mapping attribute, wherein the logical to physical mapping attribute is stored in one of a plurality of attribute libraries each attribute library containing to physical mapping attributes specifying how cells in the logical library map to physical cells in the physical library.

21. The computer program product of claim 20, wherein the configuration data for an identified logical cell is retrieved from one of a plurality of database cell views, and the configuration data enables mapping a logical cell to a plurality of technology-specific physical designs.

22. The computer program product of claim 20, wherein the configuration data comprises logical to physical mapping information stored as a separate database cell view.

23. The computer program product of claim 22, wherein a logical design has multiple database cell views, each database cell view representing a different group of configuration settings.

24. The computer program product of claim 20, wherein the configuration data comprises configuration settings used to map a logical cell to a physical domain.

25. The computer program product of claim 20, wherein the physical design is decoupled from the logical design such that the logical design can be mapped to another physical design comprising a physical cell from a new physical library without changing a logical to physical mapping attribute.

26. The computer program product of claim 20, wherein the physical design comprises an elaboration tree having a plurality of entries corresponding to an occurrence in the logical design.

27. The computer program product of claim 26, wherein the elaboration tree comprises a plurality of logical to physical mapping attributes.

28. The computer program product of claim 20, wherein modifications made by a user to a logical to physical mapping attribute in the logical design are used to update the configuration data.

29. The computer program product of claim 20, wherein the instructions are further configured to cause a processor to perform the operation of specifying configuration data for a soft block component and a soft block parameter.

* * * * *

UNITED STATES PATENT AND TRADEMARK OFFICE
CERTIFICATE OF CORRECTION

| | | |
|---|---|---|
| PATENT NO. | : 7,805,698 B1 | Page 1 of 1 |
| APPLICATION NO. | : 11/857985 | |
| DATED | : September 28, 2010 | |
| INVENTOR(S) | : Kenneth Ferguson et al. | |

It is certified that error appears in the above-identified patent and that said Letters Patent is hereby corrected as shown below:

Claim 20 - column 16, line 7:

"library containing to physical mapping attributes specifying ..." should read as follows --library containing logical to physical mapping attributes specifying ...--

Signed and Sealed this

Thirtieth Day of November, 2010

David J. Kappos
*Director of the United States Patent and Trademark Office*